United States Patent
Pavlov

(10) Patent No.: US 9,029,772 B2
(45) Date of Patent: May 12, 2015

(54) SILICON PHOTOMULTIPLIER AND READOUT METHOD

(75) Inventor: Nikolai Pavlov, County Cork (IE)

(73) Assignee: SensL Technologies Ltd., County Cork (IE)

( * ) Notice: Subject to any disclaimer, the term of this patent is extended or adjusted under 35 U.S.C. 154(b) by 234 days.

(21) Appl. No.: 13/636,720

(22) PCT Filed: Mar. 23, 2011

(86) PCT No.: PCT/EP2011/054475
§ 371 (c)(1),
(2), (4) Date: Dec. 28, 2012

(87) PCT Pub. No.: WO2011/117309
PCT Pub. Date: Sep. 29, 2011

(65) Prior Publication Data
US 2013/0099100 A1   Apr. 25, 2013

(30) Foreign Application Priority Data
Mar. 24, 2010 (GB) .................................. 1004922.9

(51) Int. Cl.
*G01J 5/20* (2006.01)
*H01L 27/144* (2006.01)
*H01L 31/107* (2006.01)
*H01L 31/09* (2006.01)
*G01T 1/24* (2006.01)

(52) U.S. Cl.
CPC ............ *H01L 27/144* (2013.01); *H01L 31/107* (2013.01); *H01L 31/09* (2013.01); *G01T 1/248* (2013.01)

(58) Field of Classification Search
CPC ...................................................... G01T 1/148
USPC ............................................ 250/338.1–338.5
See application file for complete search history.

(56) References Cited

U.S. PATENT DOCUMENTS

| | | | |
|---|---|---|---|
| 7,652,257 B2 * | 1/2010 | Li et al. ..................... | 250/370.01 |
| 7,714,292 B2 * | 5/2010 | Agarwal et al. ........... | 250/370.01 |
| 8,003,948 B2 * | 8/2011 | Haselman et al. ............ | 250/362 |
| 2004/0245592 A1 * | 12/2004 | Harmon et al. ............... | 257/438 |
| 2008/0203309 A1 * | 8/2008 | Frach et al. ................... | 250/362 |
| 2010/0102242 A1 * | 4/2010 | Burr et al. ................. | 250/370.11 |

(Continued)

FOREIGN PATENT DOCUMENTS

| | | |
|---|---|---|
| DE | 10 2007 024 074 A1 | 11/2008 |
| GB | 2 451 678 A | 2/2009 |
| JP | 2008-287165 | 11/2008 |

OTHER PUBLICATIONS

Herbert et al., "First Results of scintillator readout with silicon photomultiplier," 2006, IEEE Tranactions on Nuclear Science, vol. 53, No. 1, pp. 389-394.*

(Continued)

*Primary Examiner* — Kiho Kim
(74) *Attorney, Agent, or Firm* — Renner, Otto, Boisselle & Sklar, LLP

(57) ABSTRACT

Silicon photomultiplier and readout method A silicon photomultiplier device is provided which comprises a first electrode arranged to provide a bias voltage to the device, a second electrode arranged as a ground electrode for the device, and a third electrode arranged to provide an output signal from the device using the second electrode as the output signal ground.

18 Claims, 4 Drawing Sheets

*Basic schematics of Silicon Photomultiplier equipped with fast electrode*

(56) References Cited

U.S. PATENT DOCUMENTS

2010/0108900 A1    5/2010  Burr et al.
2011/0108711 A1*   5/2011  Tsupryk et al. .......... 250/214 R
2011/0248175 A1*  10/2011  Frach et al. ............. 250/363.03
2011/0315856 A1*  12/2011  O'mathuna et al. ....... 250/208.2

OTHER PUBLICATIONS

Office Action for corresponding European Application No. 11 710 190.7, dated Apr. 10, 2013.
International Search Report for corresponding International Application No. PCT/EP2011/054475 mailed Feb. 2, 2012.
British Search Report for corresponding UK Application No. GB1104881.6 dated Jun. 23, 2011.

Finocchiaro et al., "Characterization of a Novel 100-Channel Silicon Photomultiplier—Part I: Noise", IEEE Transactions on Electron Devices, IEEE Service Center, Pisacataway, NJ US, vol. 54, No. 10, Oct. 1, 2008, pp. 2757-2764, XP011235122, ISSN: 0018-9383.
Hughes et al., "Tiled Silicon Photomultipliers for Large Area, Low Light Sensing Applications", Proceedings of SPIE; Ultrafast Phenomena in Semiconductors and Nanostructure Materials XI and Semiconductor Photodetectors IV, SPIE, US, vol. 6471, Jan. 1, 2007, pp. 647112-1, XP002535016, ISSN: 0277-786X.
Russo et al., "The vacuum silicon photomultiplier tube (VSiPMT): a new concept of photon detector", First Feasibility results, pp. 1966-1969, section III, figure 1.
Russo et al., "The vacuum silicon photomultiplier tube (VSiPMT): a new concept of photon detector", First Feasibility results, pp. 1966-1969, section III, figure 1 (previously listed on IDS submitted with application on Sep. 24, 2012).

* cited by examiner

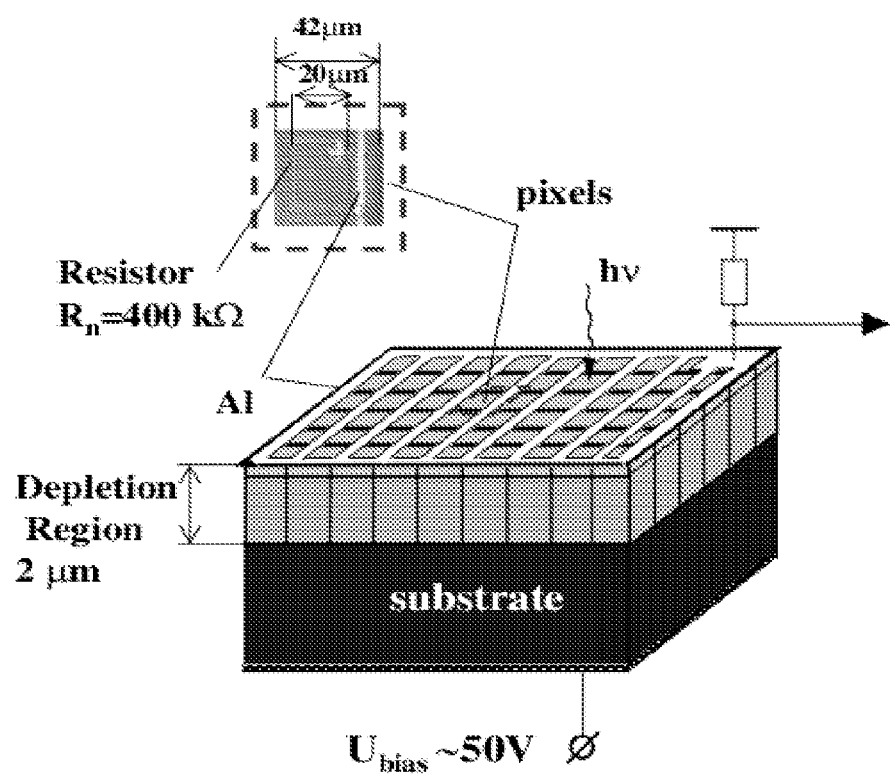
*Figure 1: The structure of Silicon Photomultiplier (as taken from "The silicon photomultiplier and its possible applications" by P.Buzhan et al.)*

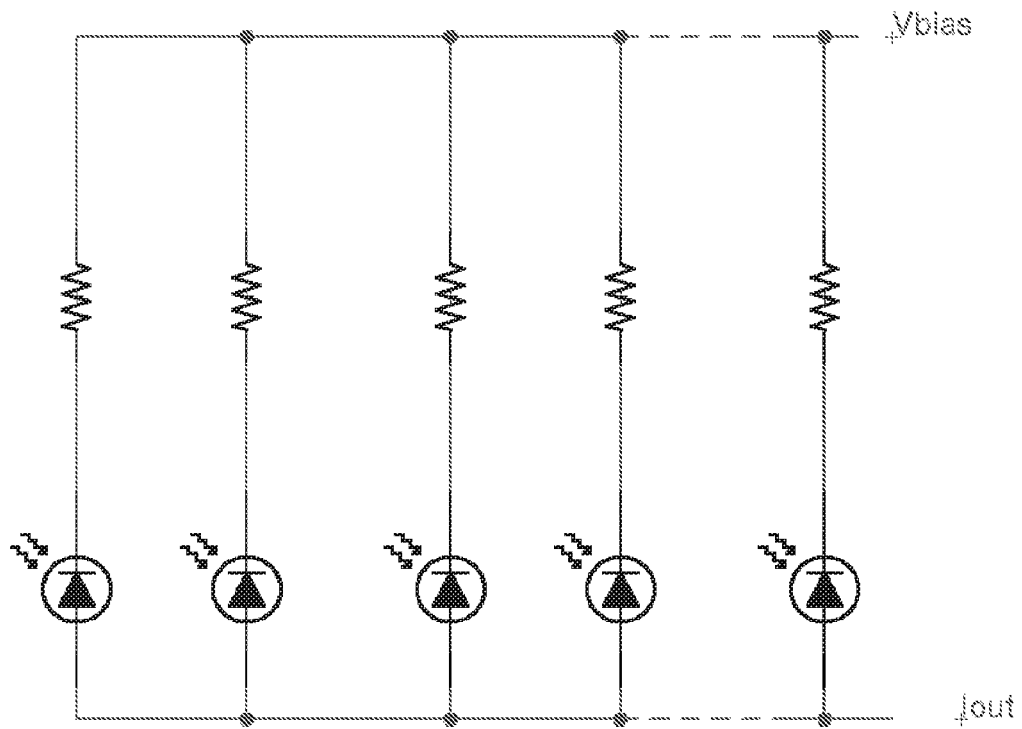
Figure 2: Equivalent schematics for conventional Silicon Photomultiplier.
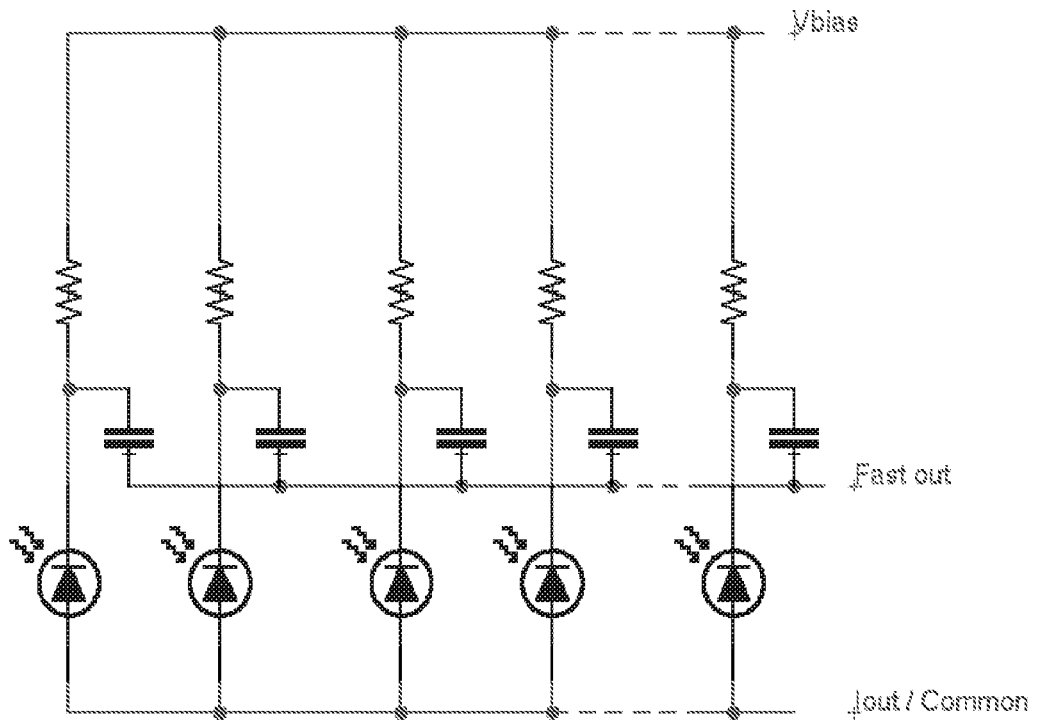
Figure 3: Basic schematics of Silicon Photomultiplier equipped with fast electrode

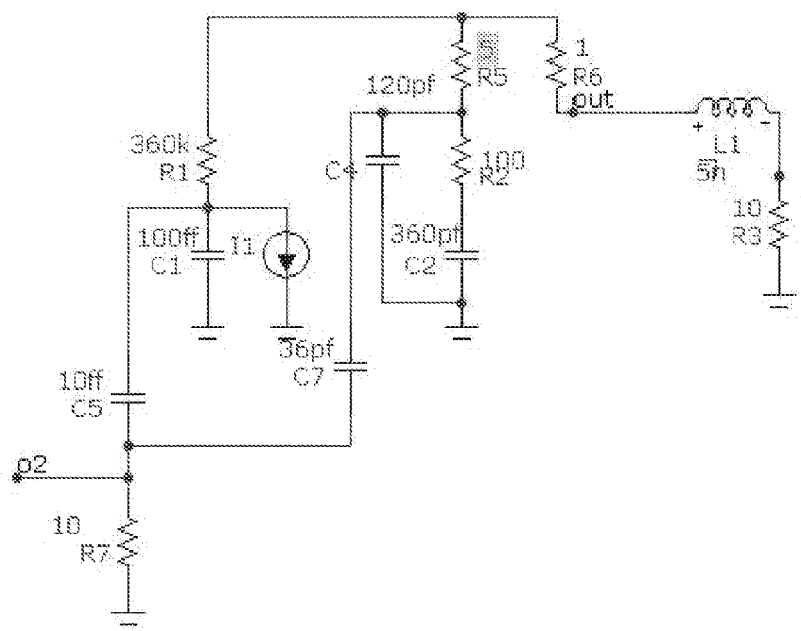
*Figure 4: Equivalent electrical simulation circuitry of 3600 photocell SPM (o2 is the Fast Output, out is used only for biasing).*

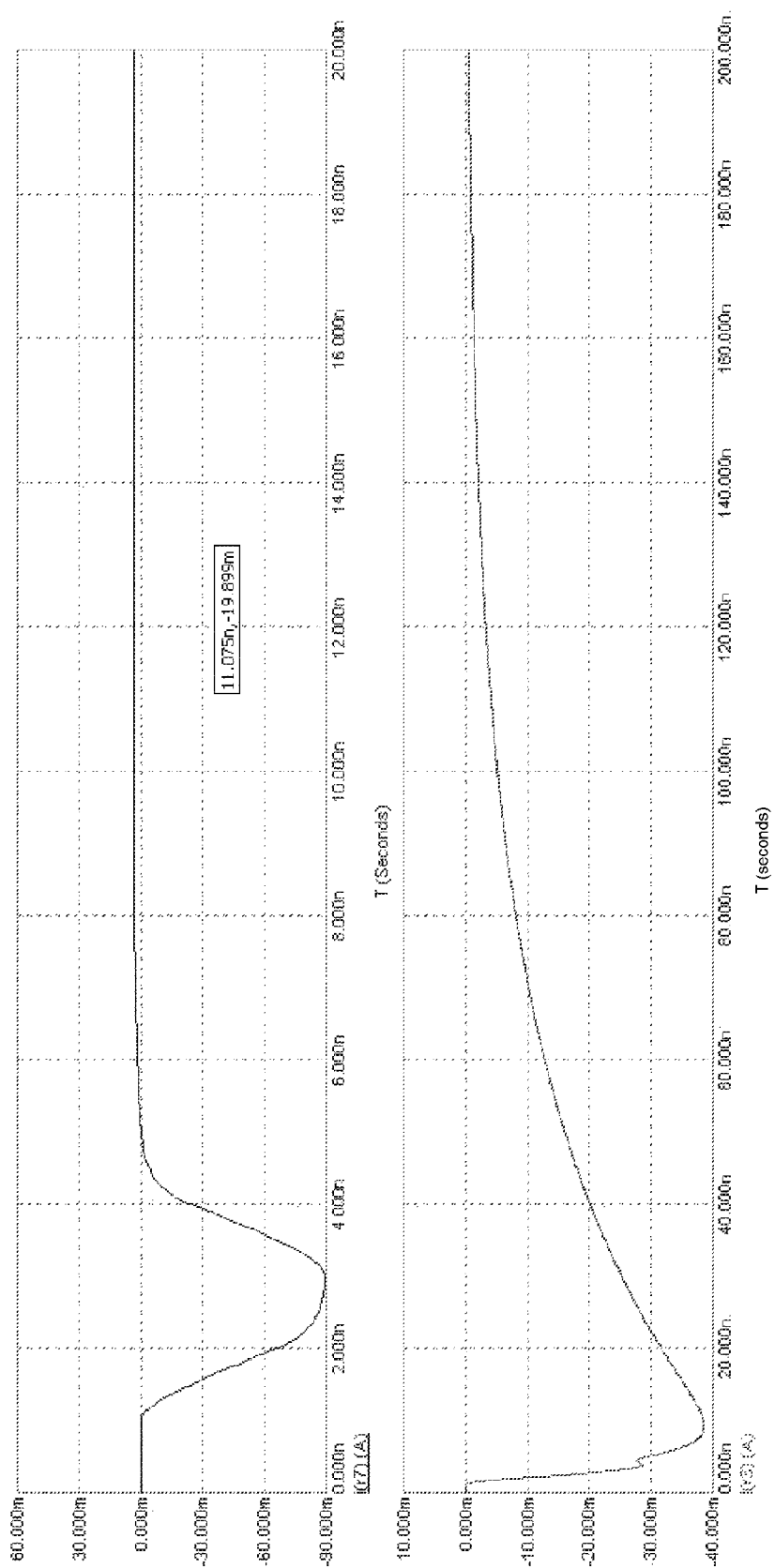
*Figure 5: Simulation of the response on both outputs. Note time scale difference.*

SILICON PHOTOMULTIPLIER AND READOUT METHOD

TECHNICAL FIELD

The present invention relates to photon detectors. In particular, the present invention relates to fast, high sensitivity photon detectors such as silicon photomultipliers, and to a readout method for silicon photomultipliers. In particular, but not exclusively, the present invention relates to silicon photomultipliers (SiPMs or SPMs) in such areas as Positron Emission Tomography [PET], including Time-Of-Flight PET [TOF-PET], Laser Ranging [LIDAR] applications, bioluminescence, High Energy Physics [HEP] detectors.

BACKGROUND

SPMs are silicon photon sensitive devices made up of an array of very small Geiger-mode avalanche photodiode (APD) cells on a silicon substrate. An example 10×10 microcell array is shown in FIG. 1 of the accompanying drawings. Each cell is connected to one another to form one larger device with one signal output. The entire device size can be as small as 1×1 mm or much larger. FIG. 2 of the accompanying drawings is a schematic diagram of a conventional silicon photomultiplier.

APD cells vary in dimension from 20 to 100 microns depending on the mask used, and can have a density of up to 1000/sq. mm. Avalanche diodes can also be made from other semiconductors besides silicon, depending on the properties that are desirable. Silicon detects in the visible and near infrared range, with low multiplication noise (excess noise). Germanium (Ge) detects infrared to 1.7 µm wavelength, but has high multiplication noise. InGaAs (Indium Gallium Arsenide) detects to a maximum wavelength of 1.6 µm, and has less multiplication noise than Ge. InGaAs is generally used for the multiplication region of a heterostructure diode, is compatible with high-speed telecommunications using optical fibers, and can reach speeds of greater than Gbit/s. Gallium nitride operates with UV light. HgCdTe (Mercury Cadmium Telluride) operates in the infrared, to a maximum wavelength of about 14 µm, requires cooling to reduce dark currents, and can achieve a very low level of excess noise.

Silicon avalanche diodes can function with breakdown voltages of 100 to 2000V, typically. APDs exhibit internal current gain effect of about 100-1000 due to impact ionization, or avalanche effect, when a high reverse bias voltage is applied (approximately 100-200 V in silicon). Greater voltage can be applied to silicon APDs, which are more sensitive compared to other semiconductor photodiodes, than to traditional APDs before achieving breakdown allowing for a larger operating gain, preferably over 1000, because silicon APDs provide for alternative doping. Reverse voltage is proportional to gain, and APD gain also varies dependently on both reverse bias and temperature, which is why reverse voltage should be controlled in order to preserve stable gain. SPMs can achieve a gain of $10^5$ to $10^6$ by using Geiger mode APDs which operate with a reverse voltage that is greater than the breakdown voltage, and by maintaining the dark count event rate at a sufficiently low level.

Geiger-mode APDs produce relatively large charge pulse when struck by a photon of the same amplitude no matter the energy of the photon. When reading out conventional APDs, noise of the preamplifier significantly degrades timing and amplitude resolution performance for short (shorter then approx 500 ns) light pulses. Comparing to conventional APDs, SPMs using Geiger mode APDs provide much higher output amplitude, essentially eliminating the impact of preamplifier noise.

Many SPM [Silicon Photomultiplier] applications call for a fast light-to-current response, with order of 1 ns or even shorter time constants. Improved time response would benefit such applications as time-resolved spectroscopy, LIDARs, TOF [time of flight] PET [Positron Emission Tomography] etc.

At the moment use of the SPM for 'fast' applications, especially large area SPMs is seriously compromised by the fact that bulk of the SPM's signal charge is released as exponentially an decaying current with a long ~50 ns time constant. However, the avalanche development process in the SPM APD is extremely fast and the long time constant arises due to the fact that the APD signals are read out through the distributed SPM's biasing circuitry.

It is desirable to provide new electrode detector configurations to enhance currently known Silicon Photomultiplier [SiPM], also known as SPM, MicroPixel Photon Counters [MPPC], MicroPixel Avalanche Photodiodes [MAPD] with improved performance in such areas as Positron Emission Tomography [PET], including Time-Of-Flight PET [TOF-PET], Laser Ranging [LIDAR] applications, bioluminescence, High Energy Physics [HEP] detectors.

Currently known Silicon Photomultipliers provide minimum output risetime of order of 1 nS and fall time of at least 10 ns. This is much longer than conventional vacuum Photomultiplier (PMTs) or silicon avalanche photodiodes (APDs) resulting in performance loss and complication of readout electronics.

SUMMARY

An embodiment of the present invention proposes a third electrode to be used as signal output while two other electrodes are maintained for biasing and signal ground. The third electrode affords a dramatic reduction in both the fall and rise time of the signal.

An embodiment of the present invention provides a three electrode silicon photomultiplier having output pulses of short duration and thereof readout method.

According to an embodiment of the present invention, a third readout electrode is proposed to be introduced in some version of the SPM. This electrode is insulated by Silicon Oxide or another dielectric from all the elements of the SPM structure but has weak capacitive coupling to each photocell. Such capacitive coupling provides fast, partial (1-10% or so) injection of the signal charge (which is of the order of 0.15 pC/photocell) when the photocell is firing. The capacitance of the third electrode toward other electrodes of the SPM stays rather low, of the order of 10% of total SPM capacitance. To implement this electrode, either a transparent conductor (for example very thin gold, transparent conducting oxide such as Indium Tin Oxide) or a grid-like structure comprising a non-transparent conductor may be used.

According to a first aspect of the invention, there is provided a silicon photomultiplier device comprising a first electrode arranged to provide a bias voltage to the device, a second electrode arranged as a ground electrode, and a third electrode arranged to provide an output signal from the device using the second electrode as the output signal ground.

The third electrode may be galvanically isolated from the first and second electrode. The signal in the third electrode may be induced electrostatically.

The device may comprise a plurality of avalanche photodiodes. The device may comprise a plurality of Geiger mode avalanche photodiodes.

The third electrode may be coupled to a cathode of the photodiode, for example via a capacitive coupling. The signal in the third electrode may be induced by capacitive coupling between the third electrode and the photodiode cathodes. The capacitance of the third electrode with the photodiode cathodes may be between 2% and 20% of the total silicon photomultiplier capacitance. The capacitance of the third electrode with the photodiode cathodes may be approximately 10%.

According to a second aspect of the invention there is provided a method of reading out a silicon photomultiplier device according to the first aspect of the present invention, comprising reading out the output signal from the third electrode using a wideband amplifier with low input impedance. The wideband amplifier may have a bandwidth greater than 200 MHz and may have an input impedance of less than 200 ohms.

According to a third aspect of the invention there is provided a method for reading out a silicon photomultiplier device according the first aspect of the invention, comprising reading out the output signal from the third electrode using a current integrating charge amplifier to provide an output proportional to the number of photodiodes firing within a period of time of interest.

BRIEF DESCRIPTION OF THE DRAWINGS

FIG. 1, discussed hereinbefore, illustrates the structure of a silicon photomultiplier;

FIG. 2, also discussed hereinbefore, is a schematic diagram of a conventional silicon photomultiplier;

FIG. 3 is a schematic diagram of a silicon photomultiplier with a third readout electrode according to an embodiment of the present invention;

FIG. 4 is an equivalent schematic circuit for simulation of a silicon photomultiplier with 3600 photocells; and FIG. 5 is the result of a simulation carried out using the schematic of FIG. 4, comparing response time using a conventional readout and from the third readout electrode.

DETAILED DESCRIPTION

Referring to FIG. 1, a silicon photomultiplier comprising an array of Geiger mode photodiodes is shown. The array is formed on a semiconductor substrate using semiconductor processes which will be known to one skilled in the art. Patterned layers of conducting material, insulating material and doped areas of semiconductor form the structure of the photodiode. As illustrated, a resistor is provided adjacent to each photodiode which may be used to limit the avalanche current. The photodiodes are electrically connected to common biasing and ground electrodes by aluminium tracking An equivalent circuit schematic is shown in FIG. 2 for a conventional silicon photomultiplier in which the anodes of an array of photodiodes are connected to a common ground electrode and the cathodes of the array are connected via current limiting resistors to a common bias electrode for applying a bias voltage across the diodes. In FIG. 3 an arrangement according to an embodiment of the invention is shown in which a third electrode is capacitively coupled each photodiode cathode to provide a fast readout of the avalanche signals from the photodiodes. When the photodiode emits a current pulse, part of the resulting change in voltage at the cathode will be coupled via mutual capacitance into the third electrode. Using a third electrode for readout avoids the compromised transient performance resulting from the relatively large RC time constant associated with the biasing circuit.

FIG. 4 shows an equivalent circuit which is used to illustrate the performance advantage of an embodiment of the invention. The current source I1 represents the avalanche current of the diode, C1 the capacitance of the photodiode and C5 the capacitance between the third electrode and the photodiode. The remaining network represents a previously considered biasing circuit and readout approach. In a previously-considered readout the current through R3 simulates the readout, while the current through R7 simulates the readout according to an embodiment of the present invention.

FIG. 5 shows the results of a simulation comparing the rise and fall times of the currents through R3 and R7 resulting from the injection of a transient avalanche current at I1. It is clear that the current through R7 responds more quickly in both rise and fall than the current through R3, clearly demonstrating the advantage of the embodiment of the invention.

An embodiment of the present invention can overcome the problems and disadvantages associated with current strategies and designs and provides new materials and methods for improving photodetectors such as SPM devices.

SPMs have the potential to become a replacement for photomultiplier tubes (PMTs) and avalanche photodiode (APDs) for use as photodetectors in positron emission topography (PET), Single photon emission computed tomography (SPECT), computed tomography (CT), and other radiation detectors. These devices are compact, have high gain, high quantum efficiency (about 20%-70%, which is better than that of traditional PMTs) and low noise. These devices have the potential to be used in time-of-flight PET applications due to their potential timing performance. They are also insensitive to magnetic fields, a quality which makes them ideal for use in an MR (magnetic resonance) environment.

One embodiment of this invention is directed to a silicon photomultiplier (SPM) device comprising a three electrode connection scheme where two electrodes are used for biasing of the SPM and as the signal and ground electrodes, while a third electrode is used to read out the signal, using one of the first two electrodes as signal ground. The third electrode is galvanically isolated from the first two electrodes and capacitively coupled to each Geiger-mode photosensitive cell. Preferably, the SPM device comprises an array of Geiger-mode avalanche photodiode (APD) cells wherein the array produces an output pulse proportional to an input photon pulse.

Another embodiment is directed to the readout method of a three electrode SPM device, wherein the third (signal) electrode is read out using wideband (bandwidth >200 MHz) amplifier with low input impedance (<200 ohm) proving output pulses with less then 5 nS duration.

Another embodiment is directed to the readout method of a three electrode SPM device, where the third (signal) electrode is read out using a charge sensitive (current integrating) amplifier providing an output proportional to the number of Geiger-mode photosensitive cells firing within some period of time of interest.

In summary, an embodiment of the present invention provides a silicon photomultiplier [SPM] device having a three electrode connection scheme where two electrodes are used for biasing of the SPM and as the signal ground electrode, while a third electrode is used to readout the signal using one of the first two electrodes as signal ground.

The third electrode may be galvanically isolated from first two electrodes and capacitively coupled to each Geiger-mode photosensitive cell. The signal in the third electrode may be induced electrostatically.

In a readout method for such a SPM device, the third (signal) electrode may be read out using wideband (e.g. bandwith >200 MHz) amplifier with low input impedance (e.g. <200 ohm) providing output pulses with less than e.g. 5 ns duration.

In a readout method for such a SPM device, the third (signal) electrode may be read out using charge sensitive (current integrating) amplifier providing an output proportional to the number of Geiger-mode photosensitive cells firing within a period of time of interest.

It will be appreciated that reference herein to a three electrode connection scheme does not preclude the possibility that the device has a fourth and possibly further electrodes provided for other purposes.

It will be appreciated by the person of skill in the art that various modifications may be made to the above described embodiments without departing from the scope of the present invention.

The invention claimed is:

1. A silicon photomultiplier device comprising:
   a plurality of photosensitive cells,
   a first electrode arranged to provide a bias voltage to the photosensitive cells,
   a second electrode arranged as a ground electrode for the photosensitive cells,
   one or more quench elements connected between the photosensitive cells and one of the first and second electrodes, and
   a third electrode capacitively coupled to the one or more quench elements and the photosensitive cells and arranged to provide an output signal from the photosensitive cells using the second electrode as the output signal ground.

2. A device according to claim 1, wherein the third electrode is galvanically isolated from the first and second electrodes.

3. A device according to claim 1, being adapted to induce the output signal in the third electrode electrostatically.

4. A device according to claim 1, being adapted to induce the output signal in the third electrode by a capacitive coupling between the third electrode and each of the photosensitive cells.

5. A device according to claim 4, wherein the capacitance of the capacitive coupling is between 2% and 20% of a total capacitance for the device.

6. A device according to claim 5, wherein the capacitance of the capacitive coupling is approximately 10% of the total capacitance.

7. A device according to claim 1, wherein each photosensitive cell comprises an avalanche photodiode.

8. A device according to claim 7, wherein the avalanche photodiode is a Geiger mode avalanche photodiode.

9. A method of reading out a silicon photomultiplier device according to claim 1, comprising reading out the output signal from the third electrode using a wideband amplifier with low input impedance.

10. A method according to claim 9, wherein the wideband amplifier is one having a bandwidth greater than 200MHz.

11. A method according to claim 9, wherein the wideband amplifier is one having an input impedance of less than 200ohms.

12. A method of reading out a silicon photomultiplier device according to claim 1, comprising reading out the output signal from the third electrode using a current integrating amplifier to provide an output proportional to the number of photosensitive cells of the device firing within a period of time of interest.

13. A silicon photomultiplier device having a three electrode connection scheme in which two (of the three) electrodes are used respectively for biasing of the silicon photomultiplier and as the signal ground electrode, with a third (of the three electrodes) being used to read out the signal using one of the first two electrodes as signal ground, and further including one or more quench elements connected between photosensitive cells and one of the two electrodes, wherein the third electrode is capacitively coupled to the one or more quench elements and the photosensitive cells.

14. A device according to claim 13, wherein the third electrode is galvanically isolated from the first two electrodes.

15. A device according to claim 13, wherein the signal in the third electrode is induced electrostatically.

16. A readout method for a silicon photomultiplier device according to claim 13, wherein the third (signal) electrode is read out using a wideband (for example bandwidth >200MHz) amplifier with low input impedance (for example <200 ohm) providing output pulses with less than for example 5ns duration.

17. A readout method for a silicon photomultiplier device according to claim 13, wherein the third (signal) electrode is read out using a charge sensitive (current integrating) amplifier providing an output proportional to the number of Geiger-mode photosensitive cells firing within a period of time of interest.

18. A device according to claim 13, wherein the third electrode is capacitively coupled to each Geiger-mode photosensitive cell of the silicon photomultiplier.

* * * * *